(12) United States Patent
Gailus et al.

(10) Patent No.: US 7,929,929 B2
(45) Date of Patent: Apr. 19, 2011

(54) METHOD AND APPARATUS FOR SPUR REDUCTION IN A FREQUENCY SYNTHESIZER

(75) Inventors: Paul H. Gailus, Prospect Heights, IL (US); John J. Bozeki, Elgin, IL (US); Joseph A. Charaska, Melrose Park, IL (US); Vadim Dubov, Boca Raton, FL (US); Manuel P. Gabato, Jr., Elmhurst, IL (US); Armando J Gonzalez, Miami, FL (US)

(73) Assignee: Motorola Solutions, Inc., Schaumburg, IL (US)

( * ) Notice: Subject to any disclaimer, the term of this patent is extended or adjusted under 35 U.S.C. 154(b) by 610 days.

(21) Appl. No.: 11/860,636

(22) Filed: Sep. 25, 2007

(65) Prior Publication Data

US 2009/0081984 A1 Mar. 26, 2009

(51) Int. Cl.
*H04B 1/18* (2006.01)
(52) U.S. Cl. ............... 455/165.1; 455/161.2; 455/196.1; 455/216; 455/239.1; 455/242.2; 327/156; 331/25
(58) Field of Classification Search ............... 455/165.1, 455/161.1, 161.2, 171.1, 183.1, 183.2, 208, 455/209, 210, 239.1, 240.1, 255, 258–260, 455/262, 264, 265, 318, 323, 196.1, 216, 455/242.2, 164.1, 63.1, 67.13, 118, 136, 455/150.1, 180.3, 182.1, 192.1, 192.2, 234.1, 455/234.2, 112–113, 242.1; 327/105, 156–159, 327/9, 12; 331/175, 1, 25, 8, 10–12, 14, 331/17–18, 156; 375/327, 394, 376
See application file for complete search history.

(56) References Cited

U.S. PATENT DOCUMENTS

| | | | |
|---|---|---|---|
| 4,816,774 | A | 3/1989 | Martin |
| 5,055,802 | A | 10/1991 | Hietala |

(Continued)

FOREIGN PATENT DOCUMENTS

EP 1729432 B1 12/2008

(Continued)

OTHER PUBLICATIONS

Brennan, V.P., "Intermodulation-Borne Factional-N Frequency Synthesiser Spurious Components", IEEE Proc-Circuits Devices Syst., Dec. 2004.

(Continued)

*Primary Examiner* — Pablo N Tran
(74) *Attorney, Agent, or Firm* — Valerie M. Davis

(57) ABSTRACT

A frequency synthesizer includes: a frequency source generating a reference signal that includes a plurality of pulses having periodicity based on a reference frequency; a feedback loop that includes, a phase detector circuit, a loop filter, a controlled oscillator that generates an output signal at an output, and a loop divide circuit; a non-linear circuit element at an input of the phase detector circuit, which generates intermodulation distortion that causes at least one spurious signal at the output; and a controller controlling the loop divide circuit and the non-linear circuit element. The frequency synthesizer further includes a dither circuit that adjusts the timing of some of the pulses of the reference signal based on a parameter provided by the controller to the non-linear circuit element, thereby, providing a jittered reference signal to the non-linear circuit element for attenuating the at least one spurious signal at the output.

17 Claims, 10 Drawing Sheets

U.S. PATENT DOCUMENTS

| | | | |
|---|---|---|---|
| 5,781,044 A * | 7/1998 | Riley et al. | 327/105 |
| 5,872,807 A * | 2/1999 | Booth et al. | 375/130 |
| 6,002,273 A * | 12/1999 | Humphreys | 327/3 |
| 6,140,854 A | 10/2000 | Coddington | |
| 6,160,456 A * | 12/2000 | Chang | 331/25 |
| 6,219,397 B1 * | 4/2001 | Park | 375/376 |
| 6,240,127 B1 * | 5/2001 | Happonen | 375/132 |
| 6,605,935 B2 | 8/2003 | Nilsson | |
| 6,873,213 B2 | 3/2005 | Tsuda | |
| 6,952,138 B2 * | 10/2005 | Hagberg et al. | 331/25 |
| 7,145,367 B2 * | 12/2006 | Melanson | 327/5 |
| 7,271,666 B1 | 9/2007 | Melanson | |
| 7,394,320 B2 * | 7/2008 | Maurer et al. | 331/1 A |
| 7,482,885 B2 * | 1/2009 | Sridharan | 331/49 |
| 7,519,349 B2 * | 4/2009 | Sridharan | 455/285 |
| 2004/0085103 A1 | 5/2004 | Ahn | |

FOREIGN PATENT DOCUMENTS

WO  WO0193418 A2  12/2001

OTHER PUBLICATIONS

Brennan, V.P., "Role of Intermodulation in Fractional-N Frequency Synthesiser Spectral Purity", Electronic Letters, May 15, 2003.

* cited by examiner

METHOD AND APPARATUS FOR SPUR REDUCTION IN A FREQUENCY SYNTHESIZER

TECHNICAL FIELD

The technical field relates generally to frequency synthesizers and more particularly to using dither for spur reduction in a frequency synthesizer.

BACKGROUND

A frequency synthesizer is an electronic system for generating signals having a range of frequencies using the output of a single fixed timebase or oscillator. Frequency synthesizers are found in many modern devices including, but not limited to, radio transceiver apparatus, mobile telephones, radiotelephones, walkie-talkies, CB radios, satellite receivers, GPS systems, etc. Synthesizers commonly utilize a phase-locked loop to control the frequency of a controlled oscillator and thereby produce an output signal having a desired frequency. The frequency of the controlled oscillator is usually established by the voltage at a control input, and hence such a controlled oscillator is known as a voltage controlled oscillator (VCO). The output frequency of a phase-locked loop synthesizer in the locked condition is determined by the loop divide number. In fractional-N (or so-called FRAC-N) frequency synthesizers the loop divide number can have a fractional portion in addition to an integer portion. Fractional-N frequency synthesizers are particularly valued because of their ability to achieve relatively fine frequency resolution and effectively manage the compromise between lock time and sideband noise. These synthesizers dynamically switch between different relatively small integer loop divide values, one at a time, so that on the average a fractional divide number is effectively obtained over a period of time. The number of different integer loop divide values available for selection by this dynamic switching action is typically $2^K$, where K is a number of digital accumulators within the synthesizer. For example, a synthesizer having two accumulators utilizes a set of four different integer loop divide numbers; a synthesizer having three accumulators utilizes a set of eight different loop divide numbers; etc. These integer divide numbers are typically adjacent integer values, but this is not essential.

Typically, a compromise is made in selecting this set of integer loop divide values. In order to achieve relatively fast lock time and low noise, the integer loop divide values should be relatively small so that the comparison frequency at a phase detector can be correspondingly larger. However, the amount of cycle-to-cycle phase excursion that is produced by a loop divider output and then applied at a phase detector input increases at lower divide values. This phase excursion must not exceed certain bounds. Otherwise, phase detector nonlinearities will cause excessive distortion and degrade spectral purity of the synthesizer. As a result, there is a practical lower limit on the allowable integer loop divide values. For some relatively high frequency applications of fractional-N synthesizers, for example those approaching 1 GHz or more, this does not present a problem. This is because the loop divide number needed to bring such a voltage-controlled oscillator (VCO) frequency down near the frequency of commonly available crystal oscillators (typically between 10 MHz and 30 MHz) is already sufficiently large to prevent excess distortion.

There are, however, applications for fractional-N synthesizers where support for a relatively wide range of VCO frequencies is desired. For example, operation may be needed at VHF frequencies in the 100 MHz range. In addition, operation at UHF or beyond 1 GHz may be required. In order to operate at the lower VCO frequency ranges with suitable crystal oscillators, a reference frequency divider is generally used to reduce the frequency of the reference signal applied to the phase detector (and correspondingly increase the loop divide numbers), and thereby prevent the distortion problem described above. In order to achieve the best compromise in operating performance (lock time, noise, and distortion) over a wide range of VCO frequencies, the reference frequency divider is typically programmable between different allowable integer divide values.

Through extensive simulations, testing and experimentation, Applicants discovered that nonlinear elements within the signal path preceding the reference input port of the phase detector can cause intermodulation between interfering radio frequency (RF) signals (such as the VCO signal or its harmonics) and a desired signal, causing undesired spurious sidebands (also referred to herein as spurs) around the reference signal frequency. The reference frequency divider described above, together with any associated limiting amplifiers or buffers that process the crystal oscillator output signal can produce such intermodulation. If such spurious sidebands are near the reference frequency then they will be very difficult to remove once created, especially if the spurious modulation sidebands are within the synthesizer loop bandwidth, wherein the loop filter would thereby provide negligible attenuation.

It is important to note that these relatively high frequency intermodulation sidebands appearing on the reference signal are distinct from the production of low frequency spurious signals that are produced by the phase detector when it samples and down-converts RF interfering signals, which enter into the phase detector. Prior art techniques propose using dither to reduce such low frequency spurs, which is normally applied in situations where a sampling and/or quantization process produces the spurious tones.

More particularly, known techniques describe the application of dither or jitter to the phase detector input signals to impart a timing jitter on the signal edges, in order to reduce the spurious signals produced by the phase detector. However, when nonlinear elements in the signal path preceding the phase detector have already produced spurious sidebands on the reference signal as described above, Applicants further discovered during their simulations, testing and experimentation that subsequent dither of this corrupted reference signal before it is applied at a phase detector input is ineffective in reducing the spurious outputs of the synthesizer.

Thus, there exists a need for a method and apparatus for reducing spurious signals caused by non-linear elements within the signal path preceding the reference input port of the phase detector.

BRIEF DESCRIPTION OF THE DRAWINGS

The accompanying figures, where like reference numerals refer to identical or functionally similar elements throughout the separate views, which together with the detailed description below are incorporated in and form part of the specification and serve to further illustrate various embodiments of concepts that include the claimed invention, and to explain various principles and advantages of those embodiments.

Figure 1:
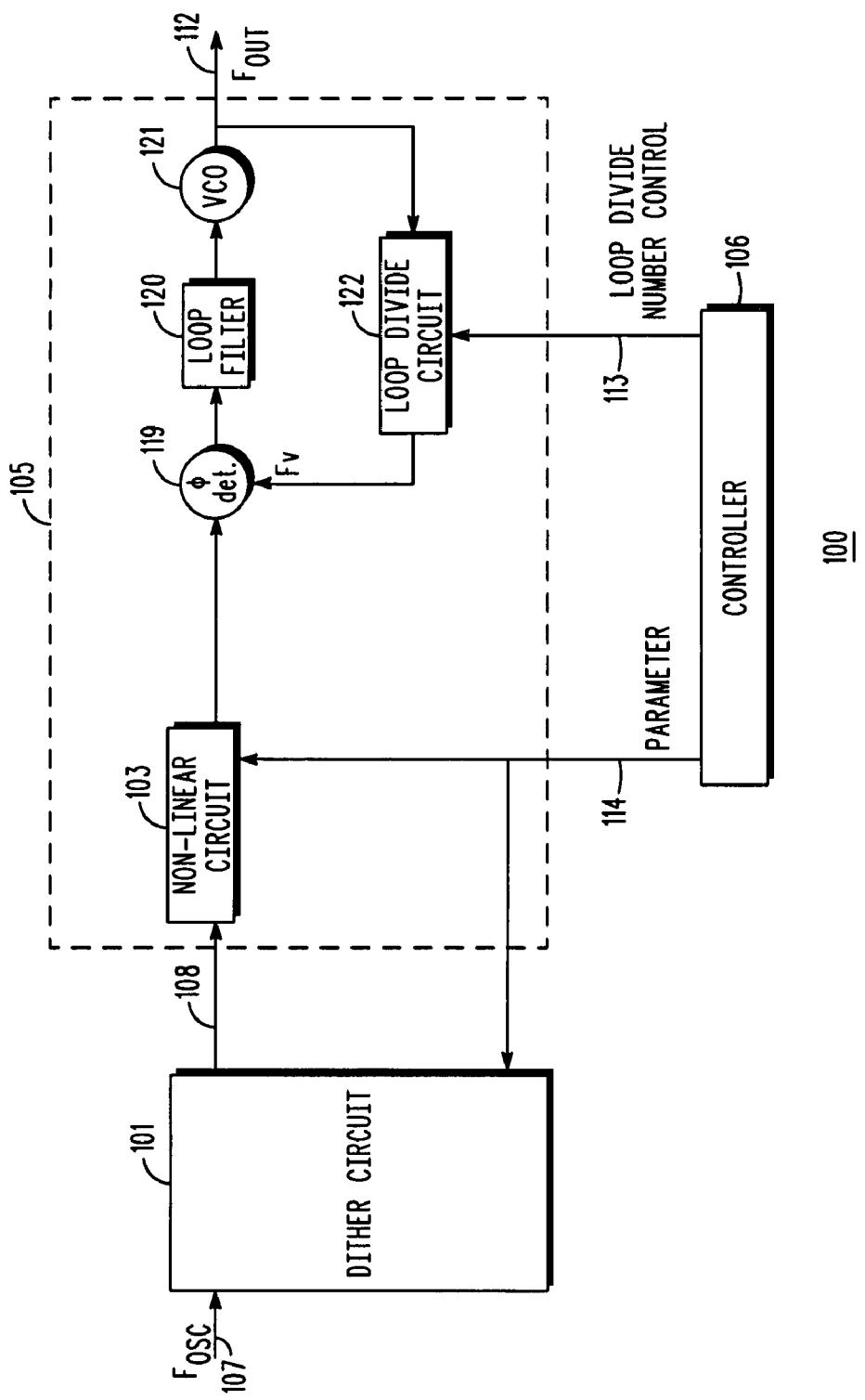
FIG. 1 is a block diagram illustrating a frequency synthesizer system in accordance with some embodiments.

Skilled artisans will appreciate that elements in the figures are illustrated for simplicity and clarity and have not necessarily been drawn to scale. For example, the dimensions of some of the elements in the figures may be exaggerated relative to other elements to help improve understanding of various embodiments. In addition, the description and drawings do not necessarily require the order illustrated. Apparatus and method components have been represented where appropriate by conventional symbols in the drawings, showing only those specific details that are pertinent to understanding the various embodiments so as not to obscure the disclosure with details that will be readily apparent to those of ordinary skill in the art having the benefit of the description herein. Thus, it will be appreciated that for simplicity and clarity of illustration, common and well-understood elements that are useful or necessary in a commercially feasible embodiment may not be depicted in order to facilitate a less obstructed view of these various embodiments.

DETAILED DESCRIPTION

Generally speaking, pursuant to the various embodiments, spurious signals caused by non-linear elements (e.g., reference frequency dividers, buffers, etc.) in the reference signal path of a frequency synthesizer are reduced. Embodiments apply dither (or jitter) at the earliest possible point in the reference signal path in order to mitigate the production of spurious signals caused by the subsequent intermodulation of the desired signal with an interfering signal. When a reference frequency divider is employed, the characteristics of the dither/jitter are modified depending on the divide number selected. Such modification maintains an effective reduction of spurious signals regardless of the point of entry of the interference into the reference signal path, as long as the intermodulation occurs after the insertion point of the dither/jitter. Those skilled in the art will realize that the above recognized advantages and other advantages described herein are merely illustrative and are not meant to be a complete rendering of all of the advantages of the various embodiments of the present invention.

Referring now to the drawings, and in particular FIG. 1, a frequency synthesizer system is shown and indicated generally at 100. System 100 comprises a frequency synthesizer 105, a controller 106 operatively coupled to and controlling operation of the frequency synthesizer 105, and a dither circuit 101 operatively coupled to the frequency synthesizer 105 and controller 106 and receiving a reference signal 107 comprising a plurality of pulses having predetermined timing based on a reference frequency $F_{OSC}$, with reference signal 107 being generated by a frequency source (not shown) comprising the frequency synthesizer system 100.

Frequency synthesizer 105 comprises a feedback loop and a non-linear circuit element 103 coupled between the dither circuit 101 and the feedback loop. The non-linear circuit element 103 can be one or more elements (e.g., reference frequency dividers, buffers, etc., depending on the particular frequency synthesizer implementation) that exhibits properties of non-linearity during operation and that generates intermodulation distortion that causes at least one spurious signal at an output 112 of the system 100. As used herein, non-linearity describes a characteristic of a device such that an output signal cannot be accurately represented as a linearly scaled version of an input signal plus a constant. The consequence of such nonlinearity is that distortion products may be produced in the output signal at frequencies where there is substantially no spectral content in the input signal. Spurious signals are unwanted signals typically caused by imperfections such as distortion or the undesired coupling of other signals. Intermodulation is a type of distortion caused by non-linearity that produces undesired spurious signal(s) at a device output when two or more distinct signal frequencies are present at the device input. Intermodulation distortion products typically occur at frequencies equal to the sum(s) and/or difference(s) of the frequencies of the input signals or their respective harmonics.

The feedback loop comprises a phase detector circuit 119, a loop filter 120 coupled to the phase detector circuit, a voltage-controlled oscillator (VCO) 121 coupled to the loop filter (which generates at the output 112 an output signal having a desired output frequency), and a loop divide circuit 122 coupled between the VCO output 112 and an input of the phase detector circuit 119. It should be realized by those of ordinary skill in the art that any suitable controlled oscillator may be used without loss of generality such as, for example, a current controlled oscillator. As such, other types of controlled oscillators are contemplated within the scope of the teachings herein. Controller 106 provides a loop divide control number 113 for controlling the loop divide circuit 122 and further controls the non-linear circuit element 103 using a parameter 114. General operation of the elements comprising frequency synthesizer 105 is well known in the art and will, therefore, not be further discussed here for the sake of brevity.

Figure 10:
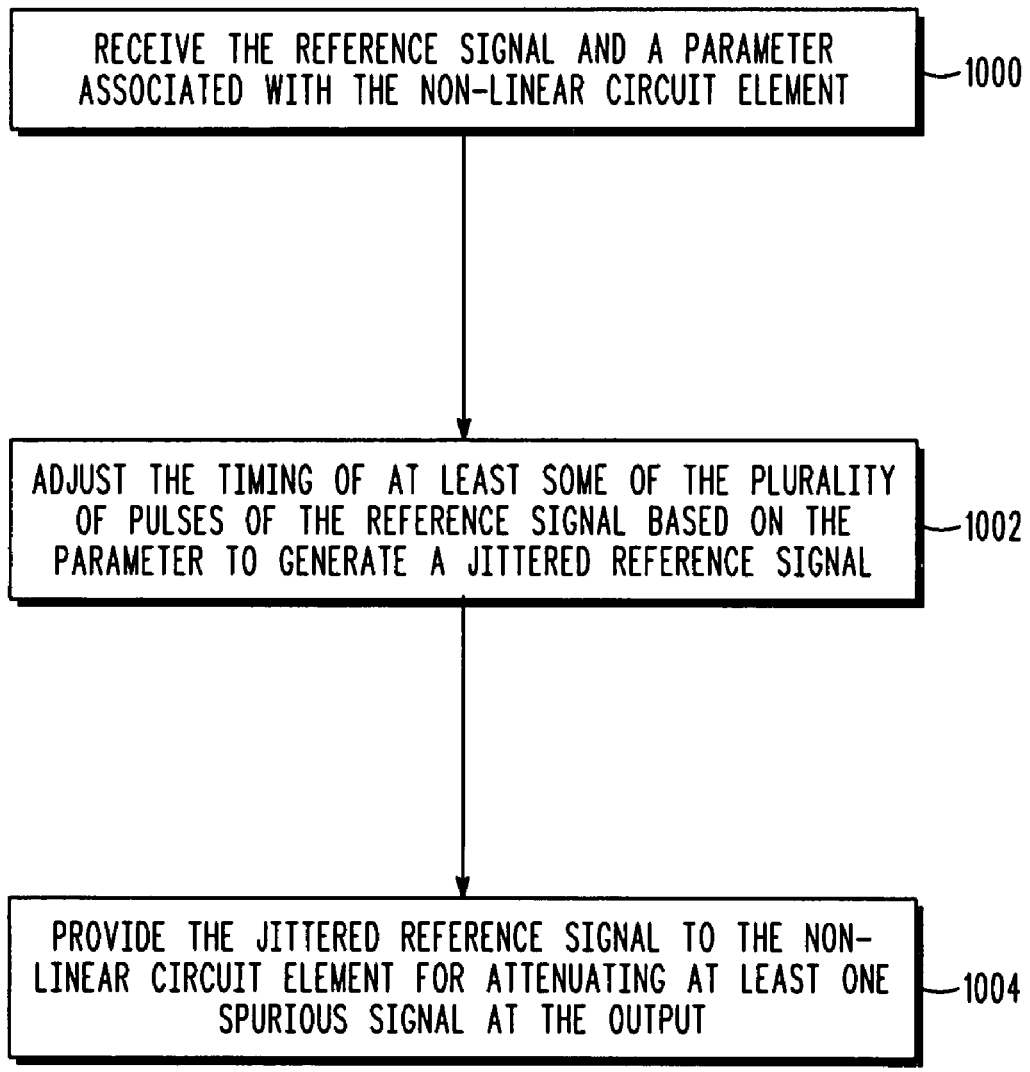
FIG. 10 is a flow diagram illustrating a method in accordance with some embodiments.

In accordance with the teachings herein (and turning momentarily to FIG. 10), the dither circuit 101, upon receiving (1000) the reference signal 107, adjusts the timing (1002) of at least some of the plurality of pulses of the reference signal under the control of the parameter 114 associated with the non-linear circuit element 103. The dither circuit 101 further provides (1004) a resulting jittered reference signal 108 to the non-linear circuit element 103 to attenuate the at least one spurious signal at the output 112, as described below in more detail.

Figure 2:
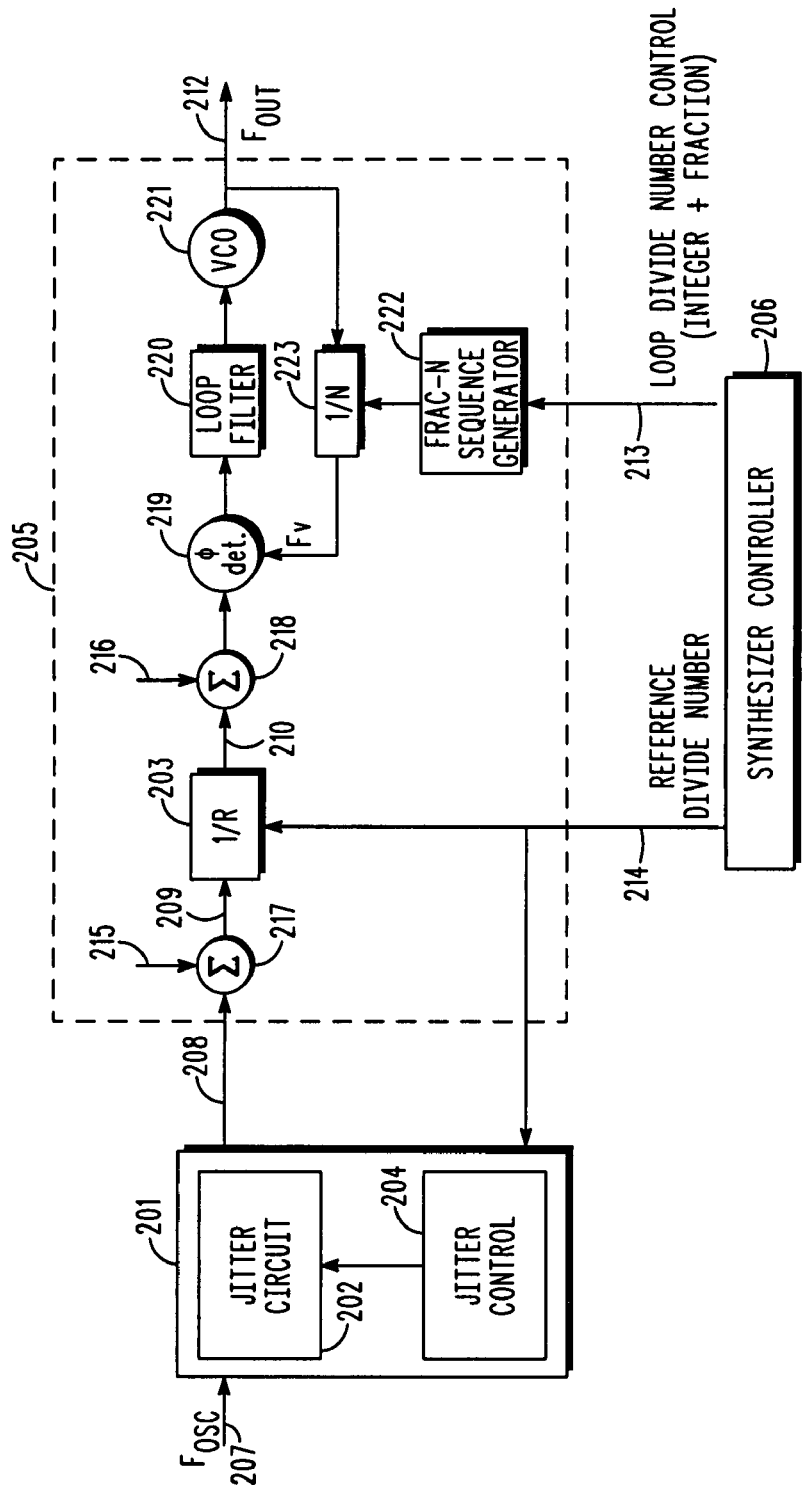
FIG. 2 is a block diagram illustrating a FRAC-N frequency synthesizer system in accordance with some embodiments.

Turning now to FIG. 2, an illustrative FRAC-N synthesizer system implementation of system 100 is shown and generally indicated at 200. In order to show a practical example of these various teachings, a particular type of frequency synthesizer embodying the inventive concepts is shown in FIG. 2. However, those skilled in the art will recognize and appreciate that the specifics of this illustrative example are not specifics of the invention itself and that the teachings set forth herein are applicable in a variety of alternative settings. For example, since the teachings described do not depend on any particular frequency synthesizer implementation, they can be applied to any type of frequency synthesizer although a FRAC-N frequency synthesizer is shown in this embodiment. As such, other alternative implementations of using different types of frequency synthesizers are contemplated and are within the scope of the various teachings described.

FRAC-N synthesizer system 200 comprises a frequency synthesizer 205, a synthesizer controller 206 operatively coupled to and controlling operation of the frequency synthesizer 205, and a dither circuit 201 (comprising a jitter circuit 202 coupled to and controlled by a jitter control 204). Dither circuit 201 is operatively coupled to the frequency synthesizer 205 and controller 206 and receives a reference signal 207 comprising a plurality of pulses having predetermined timing based on a reference frequency $F_{OSC}$, with reference signal 207 being generated by a frequency source (not shown).

Frequency synthesizer 205 comprises a feedback loop and a non-linear circuit element 203 (which in this embodiment is a reference frequency divider) coupled between the dither circuit 201 and an input of a phase detector circuit 219 included in the feedback loop. The feedback loop comprises the phase detector circuit 219, a loop filter 220 coupled to the phase detector circuit, a voltage-controlled oscillator (VCO) 221 coupled to the loop filter (which generates at an output 212 an output signal having a desired output frequency $F_{OUT}$), and a loop divide circuit coupled between the VCO output 212 and another input of the phase detector circuit 219. The loop divide circuit comprises a frequency divider circuit 223 that is controlled by a FRAC-N sequence generator 222. General operation of the elements comprising frequency synthesizer 205 is well known in the art and will, therefore, not be further discussed here for the sake of brevity.

Synthesizer controller 206 can be implemented as any suitable processing device such as a digital processor or digital signal processor. Controller 206 provides loop divide number control 213 to the FRAC-N sequence generator 222 to determine a series of integer divide values for the frequency divider circuit 223 to divide the frequency of output 212 for providing to the phase detector 219 input. Synthesizer controller 206 also provides reference divide number 214, which is the parameter used for programming reference frequency divider 203 to an integer value R selected to divide the reference frequency in order to achieve a desired compromise between lock time, noise, and distortion according to the considerations described previously. A signal having an average frequency $F_{OSC}$ is presented at reference frequency divider input 209, and the reference frequency divider output signal 210 is therefore substantially at the frequency $F_R = F_{OSC}/R$.

However, additive coupling of an unintended interfering signal 215 into the reference signal path before reference frequency divider 203 can occur and is equivalently represented with a summer 217. Correspondingly, additive coupling of an unintended interfering signal 216 into the reference signal path before phase detector 219, but after reference frequency divider 203, is equivalently represented with a summer 218. In this illustrative embodiment, dither circuit 201 applies jitter (or a timing adjustment) to input signal 207 by means of jitter circuit 202, producing the jittered output signal 208 with average frequency $F_{OSC}$. Control 204 modifies jitter characteristics based on the reference divide number 214 such that effective reduction of synthesizer spurious signals is achieved for different values of the reference divide number 214. More particularly, the jitter control 204 determines at least a jitter rate based upon the reference divide number 214 and uses this jitter rate to signal jitter circuit 202 to select the reference signal pulses to receive the timing adjustment.

Figure 3:
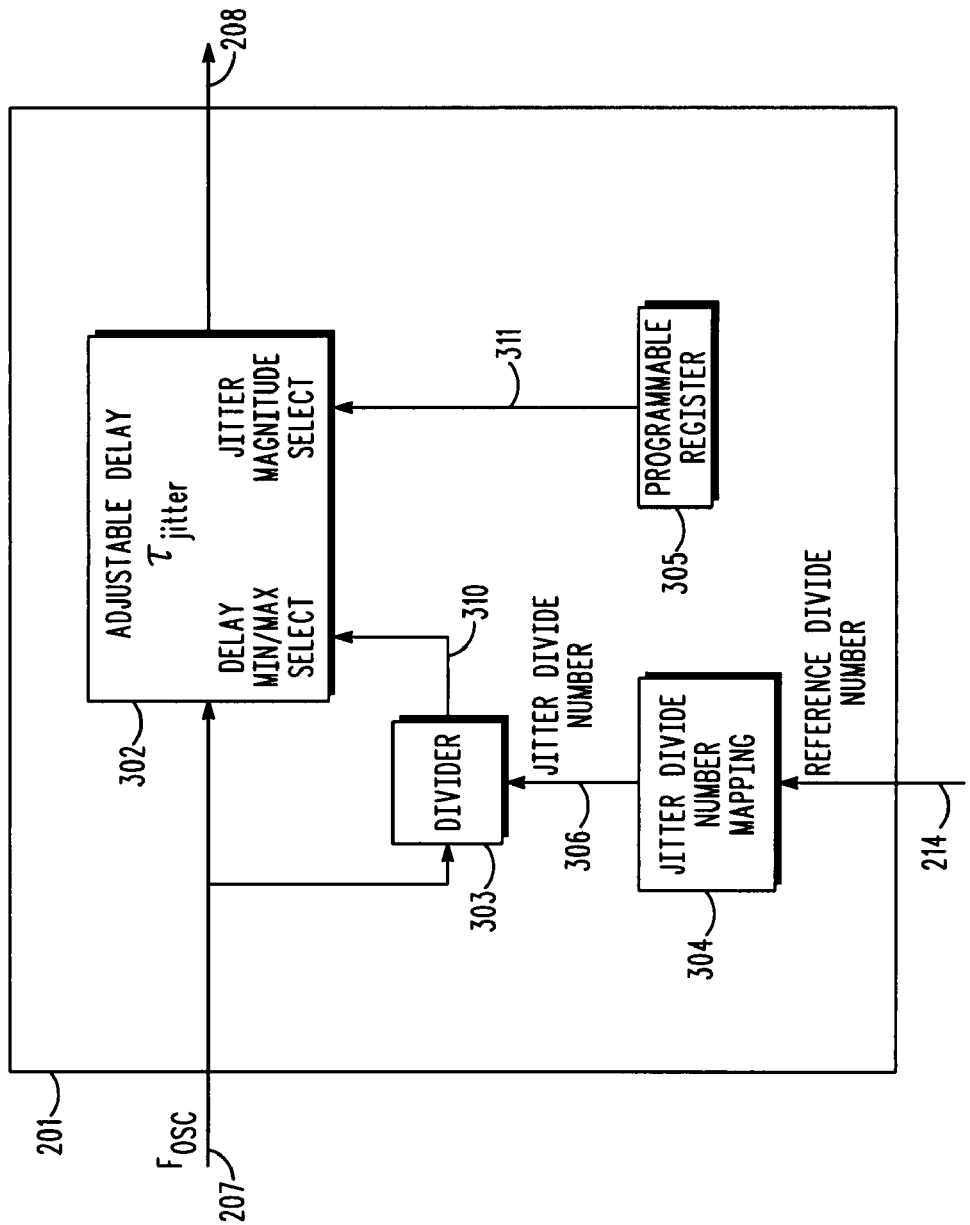
FIG. 3 is a block diagram illustrating a dither circuit in accordance with some embodiments.

FIG. 3 illustrates one embodiment of a dither circuit 201 having provision for modifying jitter characteristics based on reference divide number 214. In this embodiment, dither circuit 201 comprises an adjustable or controllable delay element 302, which serves as the jitter circuit and provides the timing adjustment to the selected pulses of the reference signal by adding a corresponding variable delay value to each selected pulse based on a jitter magnitude in order to generate the jittered reference signal 208. Moreover, jitter control to adjustable delay element 302 is provided by a divider 303, jitter divide number mapping 304 and a programmable register 305, which determine both the jitter rate and the jitter magnitude. It should be realized by those of ordinary skill in the art that the teachings herein are not limited by the particular dither circuit implementation used. For example, instead of using an adjustable delay element, dither circuit 201 may alternatively (or in addition to) comprise one or more fixed delay elements each generating a delayed reference signal, and a multiplexer that switches between the reference signal and the delayed reference signal(s), or between different delayed reference signals, based on the jitter rate for generating the resulting jittered reference signal.

More particularly, adjustable delay 302 applies a time delay $\tau_{jitter}$ to reference oscillator input signal 207. Depending on the state of a delay control 310 from divider 303, a different delay value is applied; in this case either a minimum or a maximum value of delay $\tau_{jitter}$ is applied. The amount of delay provided at the minimum and maximum settings (which is also referred to herein as the jitter magnitude or the time jitter magnitude), and hence the magnitude of the delay difference between these settings, is determined by jitter magnitude select 311 which is configured by programmable register 305 from the desired output frequency. For instance, relatively larger delay settings are selected for operation at the low end of the synthesizer output frequency range and smaller delay settings are selected for operation at the upper end of the frequency range, in order to effectively reduce synthesizer spurious output signals.

For each cycle of input signal 207, control 310 selects whether a minimum or a maximum value of time delay $\tau_{jitter}$ is applied based on the output state of divider 303. The period of the control signal 310, and therefore the jitter rate which is inversely proportional to this period, is determined by a jitter divide number 306. Jitter divide number mapping module 304 determines jitter divide number 306, and therefore the periodicity of delay control 310, for achieving effective spurious suppression with a given reference divide number 214. Jitter divide number mapping module 304 may be realized with combinatorial logic, programmable digital storage elements, a microprocessor, or other digital control means known in the art, which in an embodiment provides a predetermined sequence of the minimum and maximum value of delay $\tau_{jitter}$ to be applied to successive cycles of input signal 207. The input to output mapping within mapping module 304 to achieve spurious signal reduction can be determined by various methods including empirical measurements, simulation, and spectral analysis.

The necessity of reference divide number 214 for determining the periodicity of the applied jitter is due at least in part to the fact that reference frequency divider output signal 210 is only responsive to those edges of jittered output signal 208 which cause transitions in output signal 210. Jitter applied on other edges is effectively blocked by the divider. In other words, the jitter rate or periodicity is determined so that the pulses having the adjusted timing for the reduction of spurious output signals are propagated through the reference frequency divider 203 and are not blocked. As an example, such undesired blocking will occur if jitter divide number 306 is equal to reference divide number 214, because the period of delay control 310 will then coincide with the period of reference frequency divider output signal 210. In this case, the output transitions of reference frequency divider 203 will only be responsive to one of the selectable delay values and not to the other, and hence all jitter is effectively blocked. In other cases, partial blocking may occur. Jitter divide number mapping 304 therefore avoids these cases by determining a periodicity for delay control 310 such that blocking of the jitter that is required for spur reduction does not occur. FIGS. 4-9 show various waveforms and spectral representation to further aid in understanding the embodiments described herein.

Figure 4:
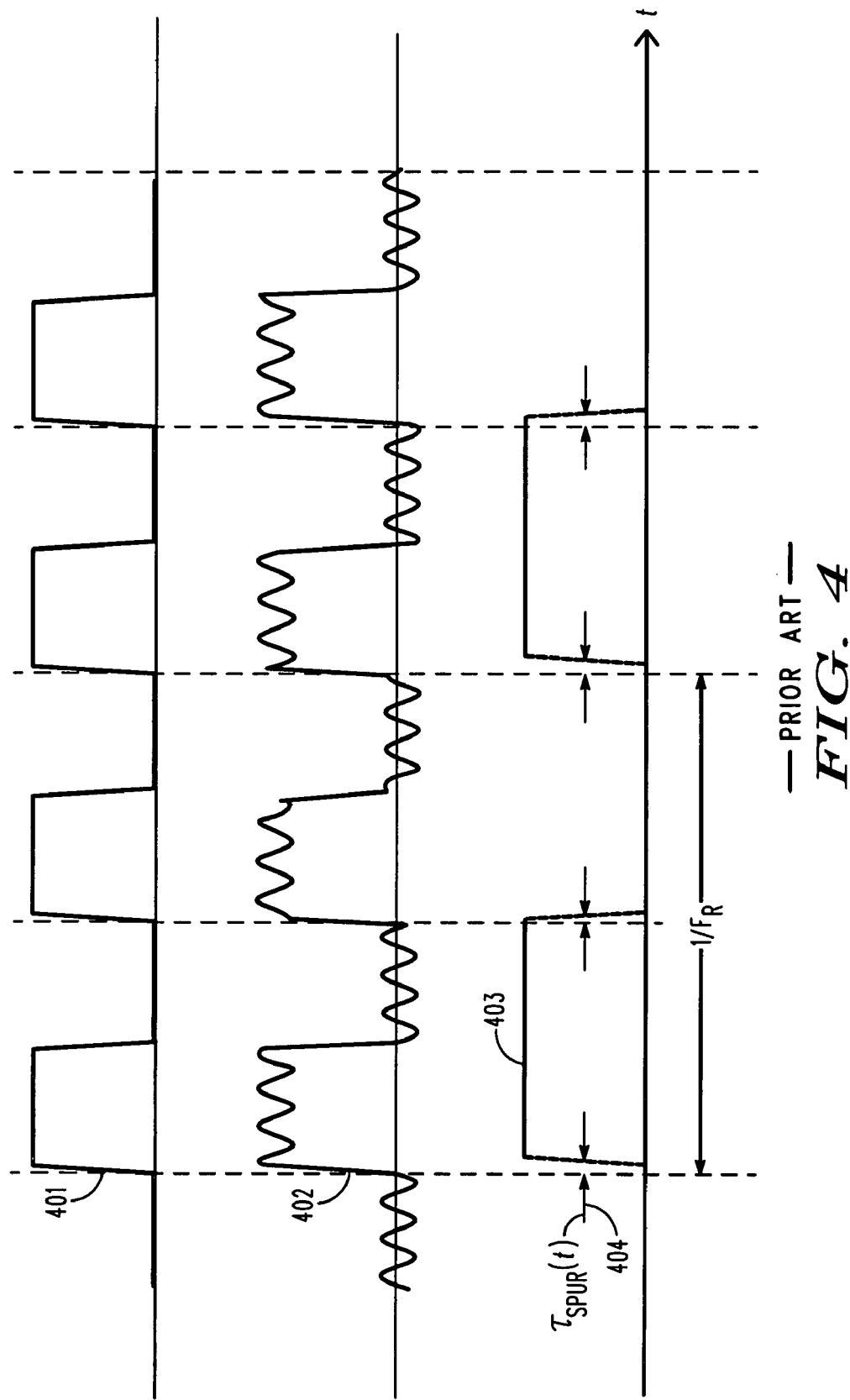
FIG. 4 shows waveforms that illustrate the production of spurs on waveforms within a reference signal path that cause spurs to be produced at a frequency synthesizer output, which are attenuated through the implementation of some embodiments.

FIG. 4 shows an example of signal waveforms within the reference signal path of prior art synthesizers where a nonlinear element, which includes a divide-by-2 function for instance, produces unwanted intermodulation of the desired signal with an interfering signal. Waveform 401 corresponds to reference oscillator input signal 207 of FIG. 2, and also to signal 208 when the dither circuit 201 (in accordance with embodiments of the present invention) is not included. Waveform 402 corresponds to reference frequency divider input signal 209 of FIG. 2, and illustrates the corruption of waveform 401 due to unwanted coupling of interfering signal 215. Waveform 403 represents the resulting reference frequency divider output signal 210. Intermodulation produced by the nonlinear element causes an undesired variation in the propagation delay applied to reference frequency divider output signal 210 as a function of time $\tau_{spur}(t)$ (404). This variation produces spurious modulation of the reference frequency divider output signal 210 about the desired reference frequency divider output signal 210 frequency $F_R$.

Figure 5:
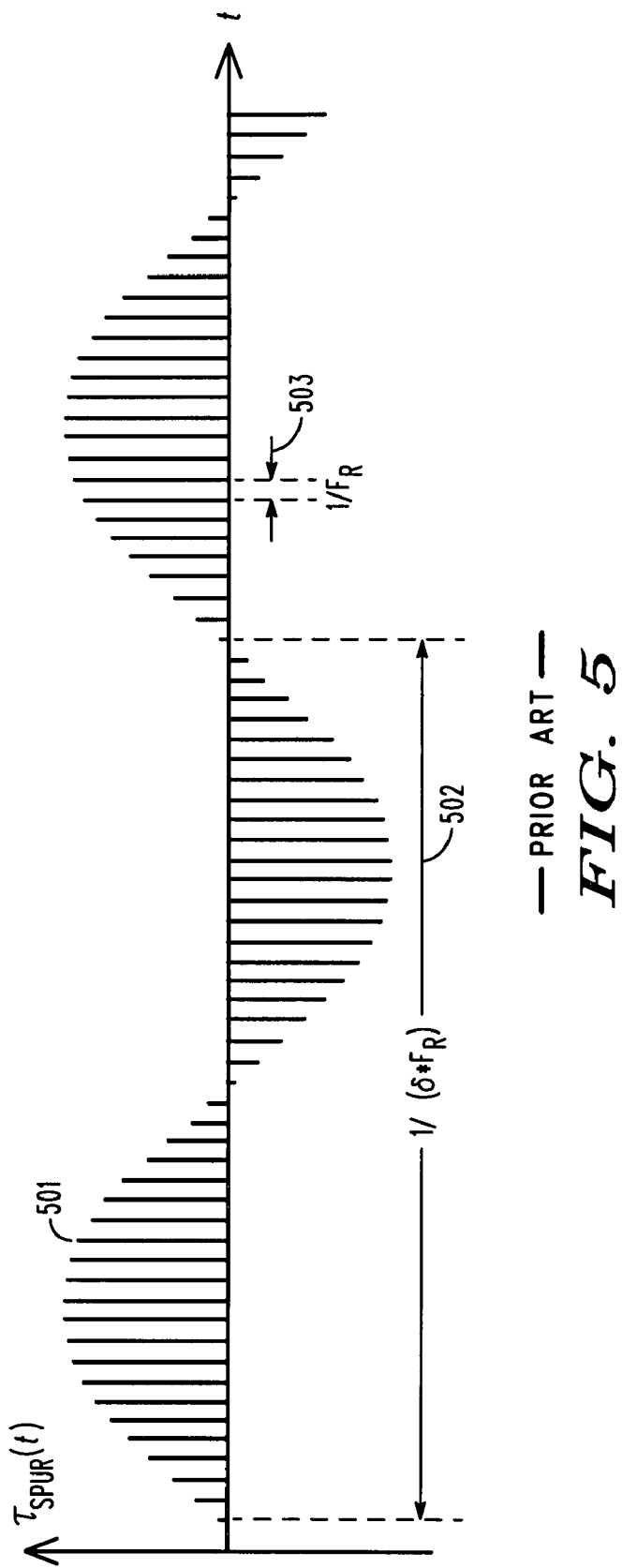
FIG. 5 shows a waveform that results in the production of spurs at a frequency synthesizer output, which are attenuated through the implementation of some embodiments.

FIG. 5 illustrates the undesired variation 501 of the propagation delay $\tau_{spur}(t)$ on each successive cycle of the reference frequency divider output signal 210, and where the nominal period 503 of these cycles is $1/F_R$. The case shown is for an interfering signal 215 having a frequency spaced $\pm\delta F_R$ from a harmonic of the desired reference frequency divider output frequency $F_R$, and where $\delta \ll 1$. This situation can arise when loop divide number control 213 of FIG. 2 is relatively close, but not equal to, an integer value N as will be described in further detail below. The undesired time variation 501 of successive edges of reference frequency divider output signal 210 therefore has a relatively long periodicity 502 of $1/(\delta^* F_R)$. This will then result in relatively high frequency spurious modulation sidebands spaced at $\pm\delta F_R$ from the desired frequency $F_R$.

Figure 6:
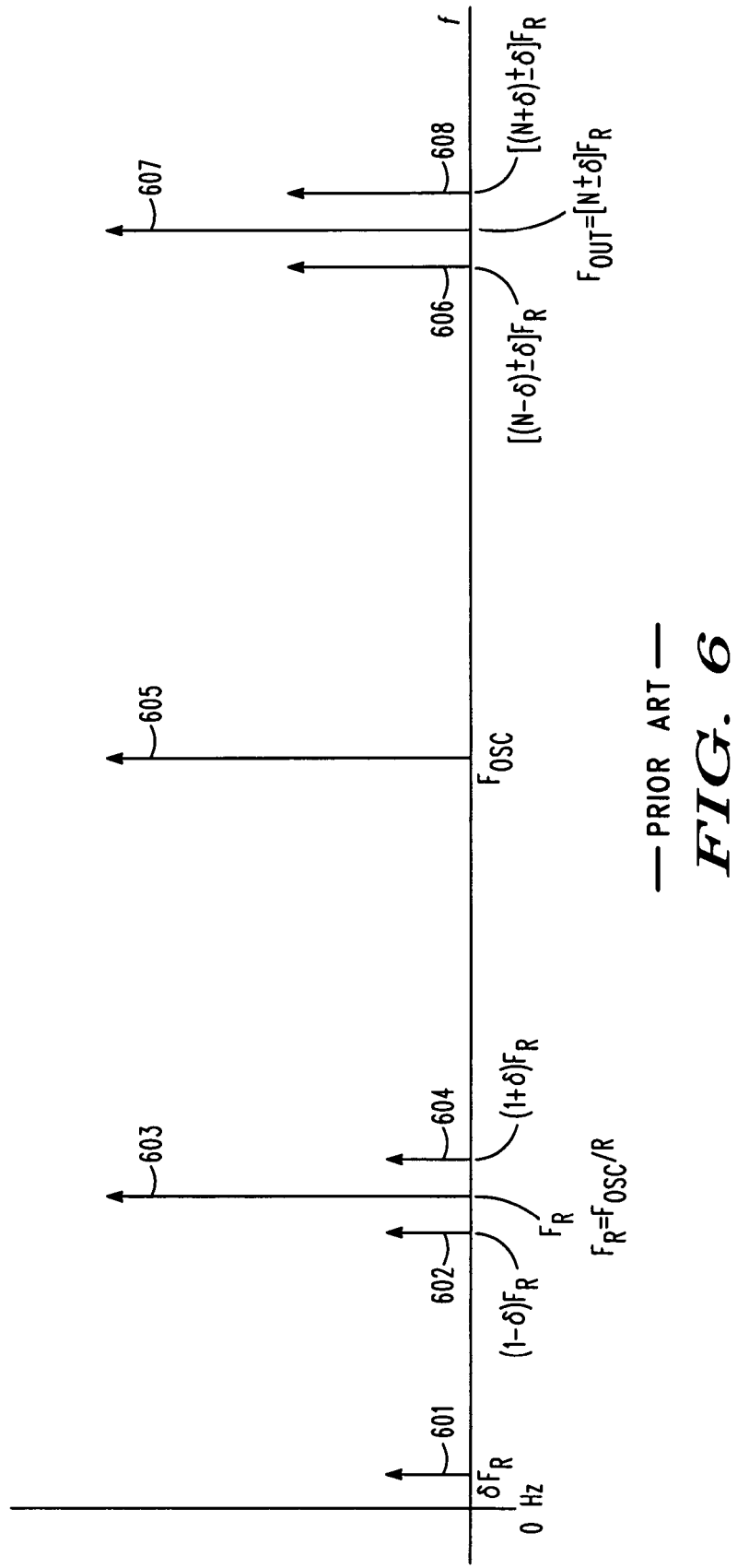
FIG. 6 illustrates a spectral representation showing spurs generated at a frequency synthesizer output, which are attenuated through the implementation of some embodiments.

FIG. 6 represents the spectral performance of a prior art synthesizer without the dither circuit 201, in accordance with embodiments of this invention. The spectrum depicts desired signals 603, 605, 607 and spurious signals 601, 602, 604, 606, 608 for the case where loop divide number control 213 in FIG. 2 is relatively close, but not equal to, an integer value N, and where a nonlinear element (e.g., reference frequency divider 203) is present within the reference signal path. In this case the desired spectral component 607 of synthesizer output signal 212 is at one of the two frequencies $F_{OUT}=[N+\delta]F_R$ where $\delta \ll 1$ and $F_R=F_{OSC}/R$, depending on whether the desired component 607 is above or below the Nth harmonic of $F_R$. Reference oscillator input signal 207 is provided at frequency $F_{OSC}$ and shown as spectral component 605. If interfering signal 215 contains energy at frequency $F_{OUT}$, then nonlinearity in reference frequency divider 203 will produce intermodulation products at output 210 in the form of spurious modulation sidebands 602, 604 spaced in close proximity at $\pm\delta F_R$ from the desired spectral component 603 at frequency $F_R$. This is due to the nonlinear mixing of interfering signal 215 having frequency $F_{OUT}$ with the (N-1)th harmonic of $F_R$, producing spurious modulation sidebands 602, 604 at frequencies $(1-\delta)F_R$ and $(1+\delta)F_R$ respectively.

In this case, phase detector 219 will demodulate these sidebands and produce a low frequency spurious tone 601 at its output having frequency $\delta F_R$. Such demodulation will occur even if the phase detector is ideal and does not create unwanted signals because of aliasing or nonlinearity. This low frequency spurious tone will be subject to relatively small attenuation in loop filter 220 and will therefore modulate VCO 221 causing corresponding spurious sidebands 606, 608 on synthesizer output signal 212 which are spaced $\pm\delta F_R$ from the desired signal 607 at frequency $F_{OUT}$. Two cases for the frequencies of 606, 608 are shown in FIG. 6, depending on whether the desired component 607 is above or below the Nth harmonic of $F_R$. If frequency $\delta F_R$ is substantially within the loop bandwidth, then the relative amplitude of spurious sidebands 606, 608 to desired synthesizer output spectral component 607 in dBc will be approximately $20 \log_{10}(N)$ higher than that of 602, 604 relative to desired reference frequency divider output spectral component 603. This amplification factor can be relatively large (for example 40 dB for N=$F_{OUT}/F_R$=1 GHz/10 MHz), making it particularly important to minimize close-in spurious 602, 604 on reference frequency divider output signal 210. This invention provides reduction of such spurious signals.

Figure 7:
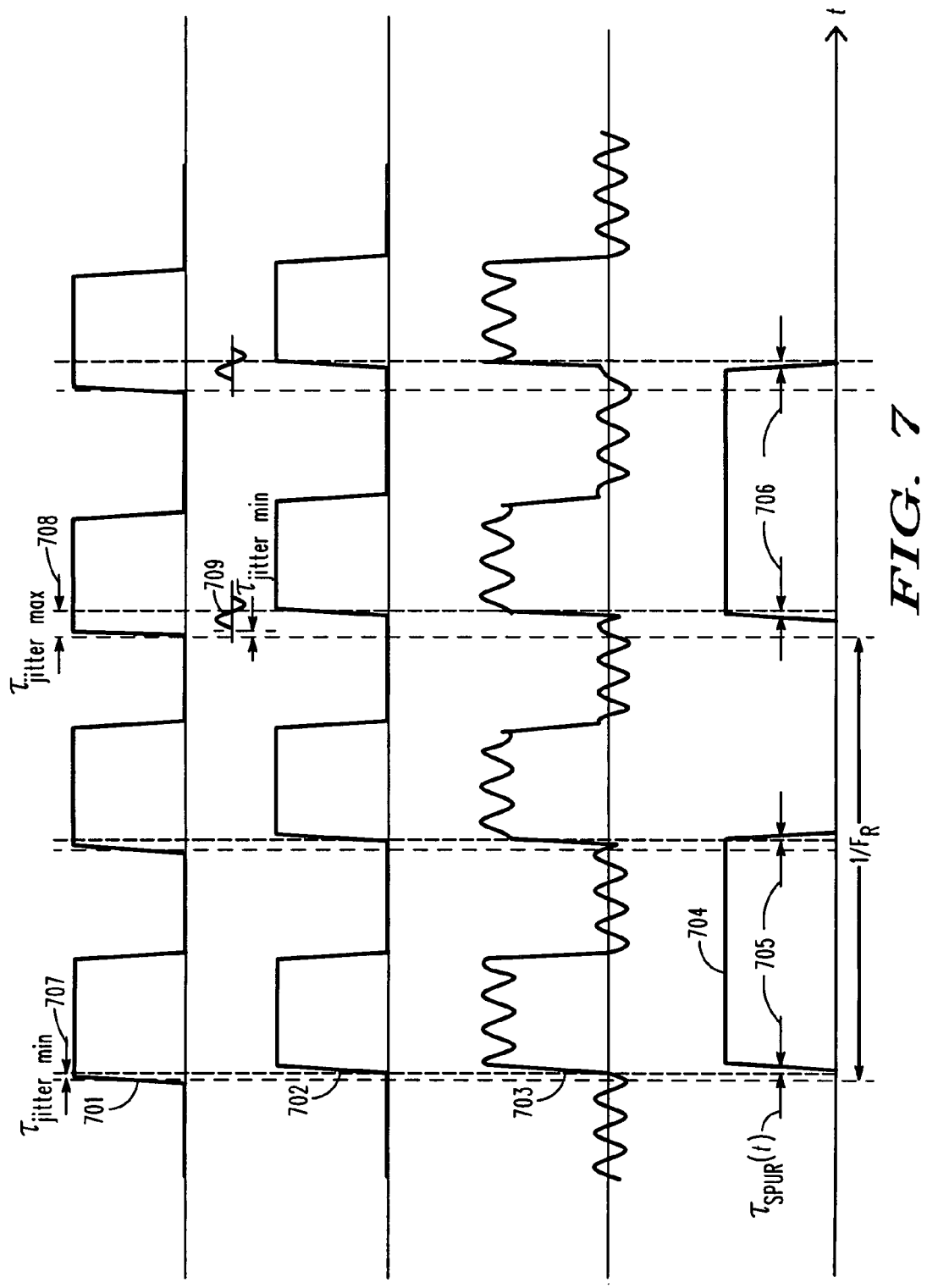
FIG. 7 illustrates operation of embodiments on signal waveforms within the reference signal path in order to attenuate spurs.

FIG. 7 shows the operation of embodiments of the invention on signal waveforms within the reference signal path in order to reduce spurious signals caused by interference (e.g., from signal 215). Waveform 701 corresponds to reference oscillator input signal 207 of FIG. 2. Waveform 702 corresponds to jittered output signal 208 in which the signal transitions are subjected to an applied time delay $\tau_{jitter}(t)$ that changes as a function of time according to control 310 in FIG. 3. In this example, dither circuit 201 alternates between a minimum amount of applied time delay $\tau_{jitter}(t)=\tau_{jitter}$ min (707), and a maximum amount of applied time delay $\tau_{jitter}(t)=\tau_{jitter}$ max 708. In this case the periodicity of the alternation in the applied delay $\tau_{jitter}(t)$ is $2/F_R$. The magnitude of the delay difference between $\tau_{jitter}$ min and $\tau_{jitter}$ max has been selected in this example to be approximately equivalent to ½ of a cycle of interfering signal 709. However, odd multiples of ½ of a cycle (³⁄₂, ⁵⁄₂, etc. are also effective).

Waveform 703 corresponds to reference frequency divider input signal 209 of FIG. 2, and includes the corruption of waveform 702 due to unwanted coupling of interfering signal 215. Waveform 704 represents the resulting reference frequency divider output signal 210. As in the prior art case of FIG. 4, intermodulation produced by a nonlinear element (e.g., element 203) causes a variation $\tau_{spur}(t)$ in the propagation delay applied to reference frequency divider output signal 210 as a function of time. However, in this case time varying jitter has been applied to the desired reference signal prior to the nonlinear element that produces the intermodulation. As a result, the undesired variation $\tau_{spur}(t)$ of the propagation delay from waveform 702 at the reference frequency divider input to waveform 704 at the reference frequency divider output substantially reverses in sign in response to the alternating jitter $\tau_{jitter}(t)$. This is shown in FIG. 7 as a time lag 705 on one cycle of waveform 704 (the reference frequency divider output signal) and a time lead 706 on the next cycle.

Figure 8:
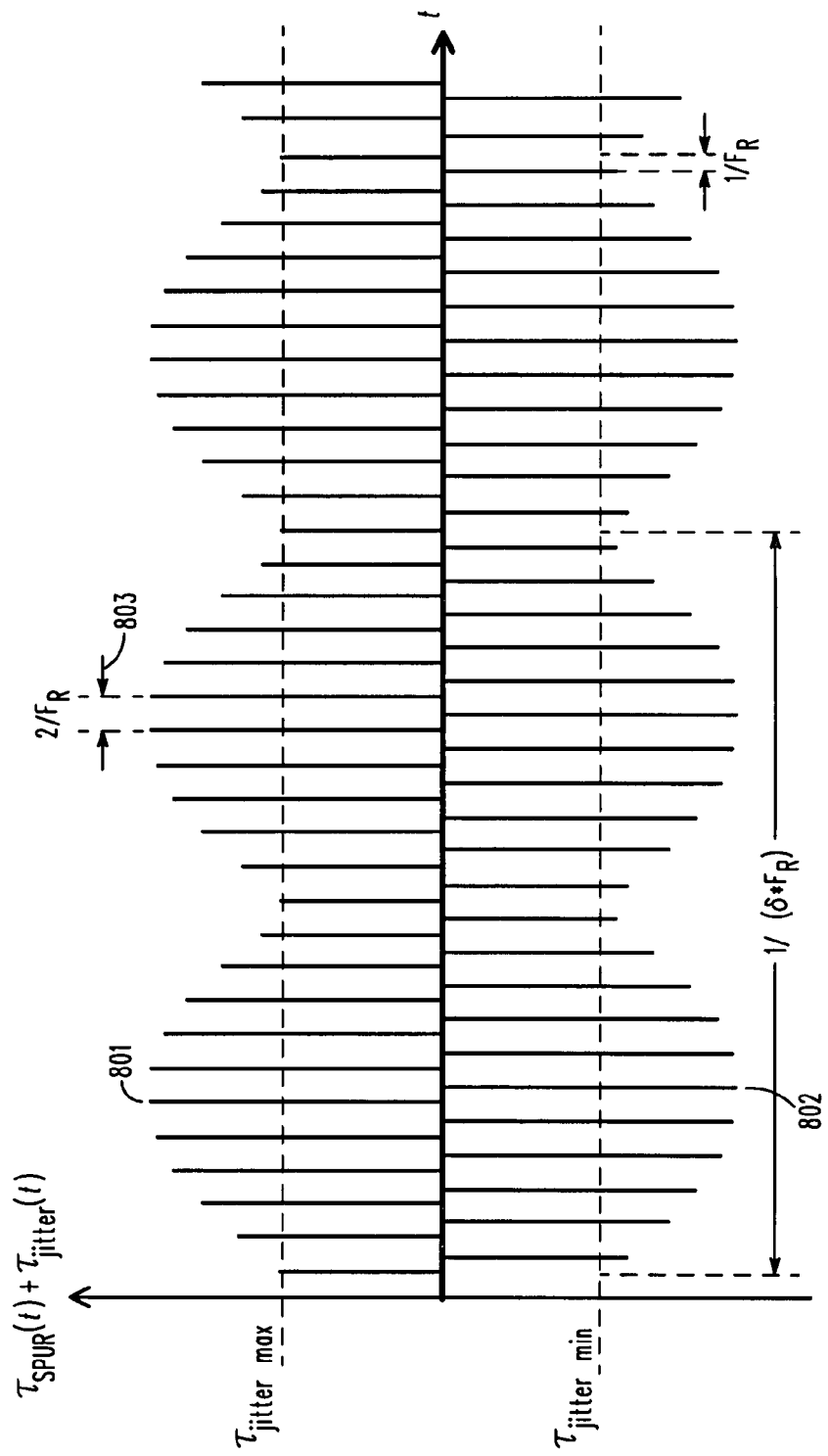
FIG. 8 illustrates the translation of a spur to a relatively high frequency using the implementation of some embodiments.

The intended interaction between the time jitter $\tau_{jitter}(t)$ applied by the invention and the resulting propagation delay variation $\tau_{spur}(t)$ is shown in FIG. 8. This figure depicts the time deviation of each successive cycle of the reference frequency divider output signal 210 (waveform 704 of FIG. 7) from corresponding cycles of a periodic waveform having a period $1/F_R$. This time deviation now includes the combination of intentional variation $\tau_{jitter}(t)$ with an unwanted variation $\tau_{spur}(t)$. This result can be compared to the prior art in FIG. 5 that does not include the applied jitter of this invention.

The time jitter magnitude ($\tau_{jitter}$ max–$\tau_{jitter}$ min) has been selected by time jitter magnitude select 311 of FIG. 3 to be an integer multiple of ½ cycle of the interfering signal as described above. As a result, $\tau_{spur}(t)$ substantially reverses in sign in response to alternating jitter $\tau_{jitter}(t)$ such that a time variation 801 associated with one cycle of reference frequency divider output signal is substantially inverted 802 on the next cycle. Over the short term, the timing deviation graphed in FIG. 8 therefore has a period 803 of $2/F_R$. As a result, the relatively low frequency spurious timing modulation of reference frequency divider output signal 210 shown as $\tau_{spur}(t)$ in FIG. 5 has been substantially translated to the relatively high frequency $F_R/2$.

It may be noted that there is a substantial alternating time deviation between $\tau_{jitter}$ min and $\tau_{jitter}$ max that has been added to reference frequency divider output signal 210. However, this modulation is periodic with a period $2/F_R$. Demodulation of this applied modulation by the phase detector will produce energy in the vicinity of $F_R/2$ and its harmonics, which is easily rejected by the loop filter.

Figure 9:
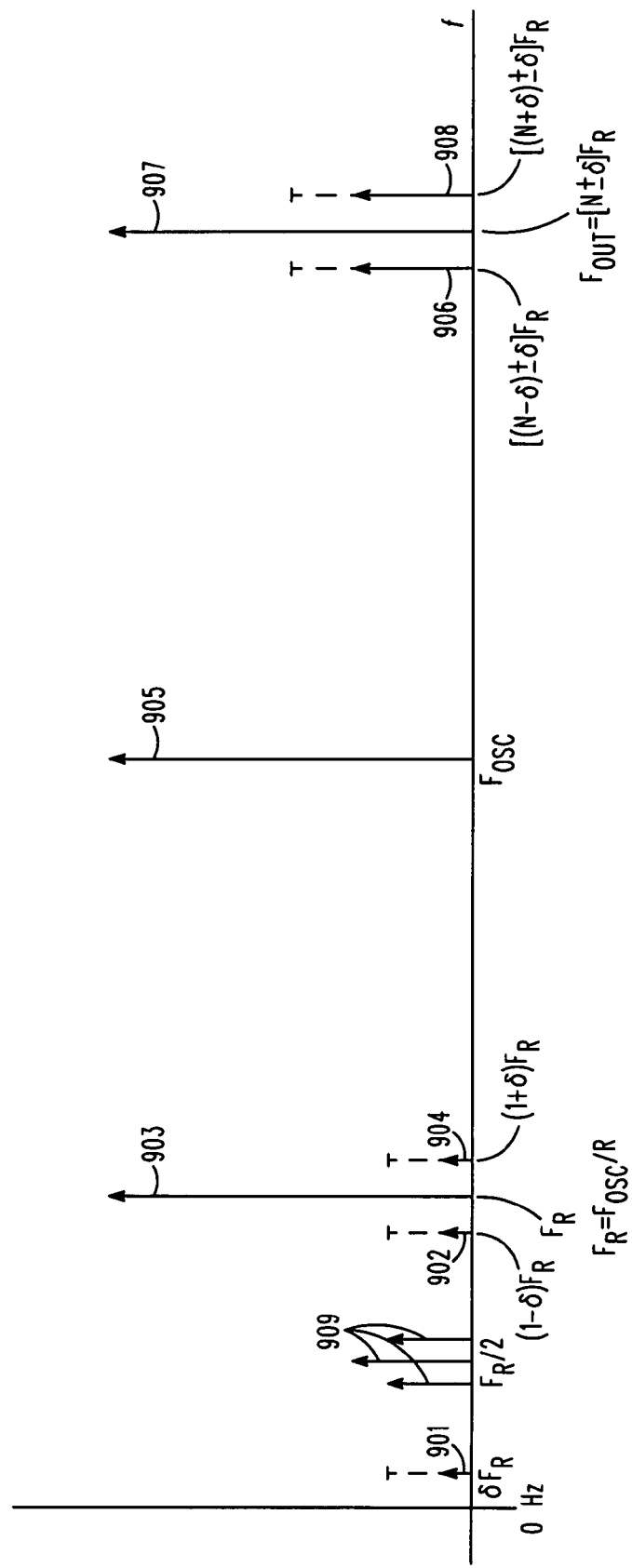
FIG. 9 illustrates spectral improvements in a frequency synthesis implementing some embodiments.

FIG. 9 shows the spectral improvements provided by the invention under the same operational conditions described for FIG. 6, whereby the loop divide number control 213 is in close proximity to an integer N. Desired signals 903, 905, 907 and spurious signals 901, 902, 904, 906, 908 correspond to desired signals 603, 605, 607 and spurious signals 601, 602, 604, 606, 608 in FIG. 6 respectively. Additional spectral components 909 are generated as a result of jittering applied by dither circuit 201. In this example, these spectral components are in close proximity to $F_R/2$, where $F_R$ is the desired frequency of the reference frequency divider output signal. Components 909 will be substantially rejected by the loop filter because their frequencies are well beyond the loop filter bandwidth.

Reference frequency divider 203 will produce a reduced level of spurious modulation sidebands 902, 904 at output 210 relative to the level of sidebands 602, 604 in the prior art of FIG. 6, due to the action of dither circuit 201 on signal 208. Phase detector 219 will demodulate these lower level sidebands 902, 904 around the reference frequency 903 and produce a reduced level low frequency spurious tone 901 at its output having frequency $\delta F_R$. This reduced level of low frequency tone 901 will result in a substantially proportional reduction in the spurious sidebands sidebands 906, 908 on synthesizer output signal 212 compared to the corresponding sidebands 606 and 608 of FIG. 6.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

Moreover, in another embodiment, the jittered reference signal is noise-shaped, and the noise-shaped jittered reference signal is provided to the non-linear circuit element to reduce spurs at the output. Such noise shaping can be performed using a sigma-delta process, for example, which is well known in the art and will not be further described here for the sake of brevity. In one embodiment, noise-shaping is applied by incorporating a sigma-delta modulator in dither circuit 201 that is clocked by the output of divider 303. The delay control 310 signal to adjustable delay element 302 is provided by the output of the sigma-delta modulator, and not directly from the divider 303 output as in a previously described embodiment. As is known in the art, a sigma-delta modulator can have two or more output values. Accordingly, adjustable delay element 302 can provide a selection of distinct delay values corresponding to each output value of the sigma-delta modulator on delay control 310.

It should be noted that the dithered signal should be applied so that all of the distinct dithered edges propagate through to the output of the reference frequency divider, and are not blocked by the normal action of this divider. Otherwise, the noise shaping characteristics will be lost, and high in-band phase quantization noise will occur, degrading the spectral performance of the synthesizer. In the noise shaping embodiment described above, jitter divide number mapping module, in response to reference divide number 214, provides a jitter divide number 306 to divider 303 such that the sigma-delta modulator is clocked at a rate which prevents blocking of the dithered edges by the reference frequency divider. A necessary condition in this case is that the jitter divide number 306 be equal to or greater than reference divide number 214. This feature of a providing a noise-shaped jittered reference signal can be used with the FRAC-N embodiment described above.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and apparatus for spur reduction in a frequency synthesizer described herein. As such, these functions may be interpreted as steps of a method to perform the spur reduction in a frequency synthesizer described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used. Both the state machine and ASIC are considered herein as a "processing device" for purposes of the foregoing discussion and claim language.

Moreover, an embodiment can be implemented as a computer-readable storage medium having computer readable code stored thereon for programming a computer (e.g., comprising a processing device) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. A frequency synthesizer comprising:
   a frequency source generating a reference signal comprising a plurality of pulses having predetermined timing based on a reference frequency;
   a feedback loop comprising,
      a phase detector circuit;
      a loop filter coupled to the phase detector circuit;
      a controlled oscillator coupled to the loop filter and generating at an output an output signal having a desired output frequency; and
      a loop divide circuit coupled between the controlled oscillator output and a first input of the phase detector circuit;
   a non-linear circuit element coupled to a second input of the phase detector circuit and generating intermodulation distortion that causes at least one spurious signal at the output;
   a controller providing a loop divide number for controlling the loop divide circuit, the controller further controlling the non-linear circuit element; and
   a dither circuit coupled between the frequency source, the non-linear circuit element and the controller and adjusting the timing of at least some of the plurality of pulses of the reference signal under the control of a parameter associated with the non-linear circuit element, which is provided by the controller, and the dither circuit further providing a resulting jittered reference signal to the non-linear circuit element for attenuating the at least one spurious signal at the output.

2. The frequency synthesizer of claim 1, wherein the non-linear circuit element comprises a reference frequency divider circuit, and the parameter is a value used for dividing the reference frequency.

3. The frequency synthesizer of claim 2, wherein the dither circuit comprises:
   a jitter circuit; and
   a jitter control that receives the value used for dividing the reference frequency and provides to the jitter circuit at least a jitter rate based on the value, wherein the jitter rate is used for selecting the pulses to receive the timing adjustment.

4. The frequency synthesizer of claim 3, wherein the jitter circuit comprises a controllable delay element that provides the timing adjustment to the selected pulses of the reference signal by adding a corresponding variable delay value to each selected pulse based on a jitter magnitude determined by the jitter control, for generating the resulting jittered reference signal.

5. The frequency synthesizer of claim 4, wherein the variable delay value is determined based on a predetermined sequence of different delay values.

6. The frequency synthesizer of claim 1, wherein the frequency synthesizer comprises a fractional-N synthesizer.

7. The frequency synthesizer of claim 1, wherein the frequency synthesizer is included in radio transceiver apparatus.

8. The frequency synthesizer of claim 1, wherein the controller comprises a digital processor.

9. A method for attenuating spurious signals in a frequency synthesizer, the frequency synthesizer comprising: a feedback loop having, a phase detector circuit, a loop filter coupled to the phase detector circuit, a controlled oscillator coupled to the loop filter and generating at an output an output signal having a desired output frequency, and a loop divide circuit coupled between the controlled oscillator output and a first input of the phase detector circuit; the frequency synthesizer further comprising a non-linear circuit element coupled to a second input of the phase detector circuit and generating intermodulation distortion that causes at least one spurious signal at the output; and a controller providing a loop divide number for controlling the loop divide circuit, the controller further controlling the non-linear circuit element, the method comprising:
   receiving the reference signal and a parameter associated with the non-linear circuit element;
   adjusting the timing of at least some of the plurality of pulses of the reference signal based on the parameter to generate a resulting jittered reference signal; and providing the jittered reference signal to the non-linear circuit element for attenuating the at least one spurious signal at the output.

10. The method of claim 9, wherein adjusting the timing of at least some of the plurality of pulses of the reference signal comprises:
  determining, from the parameter associated with the non-linear circuit element, at least a jitter rate; and
  selecting the pulses to receive the timing adjustment based on the jitter rate.

11. The method of claim 10, wherein adjusting the timing of at least some of the plurality of pulses of the reference signal further comprises:
  determining, from the desired output frequency, a jitter magnitude; and
  adding a variable delay value to each selected pulse based on the jitter magnitude.

12. The method of claim 10, wherein the variable delay value is determined based on a predetermined sequence of different delay values.

13. The method of claim 10, wherein the non-linear circuit element comprises a reference frequency divider circuit and the jitter rate is determined so that the pulses having the adjusted timing are propagated through the reference frequency divider circuit.

14. The method of claim 9, wherein the loop divide number comprises an integer portion and a fractional portion.

15. The method of claim 9, wherein the parameter associated with the non-linear circuit element is a value used for dividing the reference frequency.

16. The method of claim 9 further comprising noise shaping the jittered reference signal and providing the noise-shaped jittered reference signal to the non-linear circuit element.

17. The method of claim 16, wherein a sigma-delta process is used for the noise shaping.

\* \* \* \* \*